(12) United States Patent
Ferreri et al.

(10) Patent No.: US 6,625,798 B1
(45) Date of Patent: Sep. 23, 2003

(54) METHOD FOR TRANSLATING CONDITIONAL EXPRESSIONS FROM A NON-VERILOG HARDWARE DESCRIPTION LANGUAGE TO VERILOG HARDWARE DESCRIPTION LANGUAGE WHILE PRESERVING STRUCTURE SUITABLE FOR LOGIC SYNTHESIS

(75) Inventors: Richard A. Ferreri, Ft. Collins, CO (US); Lanzhong Wang, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 601 days.

(21) Appl. No.: 09/624,790

(22) Filed: Jul. 25, 2000

(51) Int. Cl.[7] .............................. G06F 17/50; G06F 9/45
(52) U.S. Cl. ................................ 716/18; 716/1; 716/3; 717/141; 717/159
(58) Field of Search ................... 716/18, 1, 3; 171/141, 171/159

(56) References Cited

U.S. PATENT DOCUMENTS

| 5,307,492 | A | * | 4/1994 | Benson .................. 717/159 |
| 5,339,238 | A | * | 8/1994 | Benson .................. 717/159 |
| 5,598,560 | A | * | 1/1997 | Benson .................. 717/159 |
| 5,875,334 | A | * | 2/1999 | Chow et al. ............. 717/141 |
| 6,397,341 | B1 | * | 5/2002 | Genevriere ............. 713/400 |
| 2002/0108092 | A1 | * | 8/2002 | Yasuda ................... 716/1 |
| 2002/0183997 | A1 | * | 12/2002 | Powell et al. ........... 703/13 |

OTHER PUBLICATIONS

M.G. Arnold et al, "A Synthesis Preprocessor that Converts Implicit Style Verilog Into One–Hot Designs", IEEE International Verilog HDL Conference Proceedings, Mar. 31, 1997–Apr. 2, 1997, pp. 38–45.*

* cited by examiner

Primary Examiner—Vuthe Siek
Assistant Examiner—Magid Dimyan

(57) ABSTRACT

A methodology for translating multiple bit conditional expressions of a non-Verilog hardware description language (HDL) program, not readily recognized by Verilog HDL, which can then be used to realize a logic circuit design embodied by the non-Verilog HDL program. Conditional IF expressions occurring within the HDL program that are not recognized by Verilog HDL are processed so that they can be accordingly translated to Verilog HDL syntax. If the conditional IF expression is a multiple-bit expression, a binary operator statement having bit-wise binary operators, including two AND operators, one OR operator, and one NOT operator, that is equivalent to the conditional IF expression is created. If either the THEN expr1 and/or the ELSE expr2 expressions are themselves multiple-bit expressions nested within the main multi-bit IF expression, then the nested multiple-bit expressions expr1 and/or expr2 in the binary operator statement must be replaced by the appropriate incremental variable(s) to create an always statement that can be translated to generate a Verilog HDL statement that is equivalent to the conditional expression. The nested multiple-bit expressions expr1 and/or expr2 are represented within the always statement by one or more corresponding incremental variables. Synthesis can then be performed on the always statement or on the binary operator statement, if there are no nested multiple-bit conditional expression, by a processor of a logic synthesis tool to generate a logic circuit representative of the non-Verilog HDL program.

25 Claims, 5 Drawing Sheets

METHOD FOR TRANSLATING CONDITIONAL EXPRESSIONS FROM A NON-VERILOG HARDWARE DESCRIPTION LANGUAGE TO VERILOG HARDWARE DESCRIPTION LANGUAGE WHILE PRESERVING STRUCTURE SUITABLE FOR LOGIC SYNTHESIS

FIELD OF THE INVENTION

The presented invention relates generally to the use of hardware description languages to specify circuit logic design in a format that is acceptable to logic synthesis tools, and, more particularly, to a method for translating non-Verilog HDL containing conditional expressions to Verilog HDL format and syntax.

BACKGROUND OF THE INVENTION

The soundness of logic design of hardware such as complex central processor units (CPUs) must be tested prior to actually manufacturing the hardware. Logic design may be specified in the form of Boolean equations or a hardware description language (HDL) description in a language such as Verilog HDL, an IEEE standard hardware description language (IEEE Std 1364-1995). A routine can be written in an HDL such as Verilog HDL and then be converted into a logic gate circuit using a logical synthesis tool, such as Synopsys Design Compiler™, operating on a general-purpose computer. In this manner, the logic design can be realized.

Verilog HDL, as an accepted standard, is a language accepted as an input format by many design tools available on the market today. A concern arises, therefore, when a hardware description language other than Verilog HDL is used, generically referred to as a non-Verilog HDL, since third party design tools that will accept Verilog HDL may not readily accept another HDL. Since it is desirable to increase design productivity and to thus shorten the design cycle of CPUs and other relevant hardware, it is important to leverage existing and advanced tools even if they do not accept the non-Verilog HDL. This requires that the non-Verilog HDL be translated into Verilog HDL so that it can be readily used with available tools. An important aspect of the translation into Verilog HDL is that the translation be logically correct; additionally, certain inherent semantics of the code must be preserved. Logic synthesis tools such as the Synopsys Design Compiler™ must be able to produce optimal results from the translated code.

A major concern with the translation process is encountered when certain syntax features of the non-Verilog HDL are not part of the Verilog HDL target language. Multiple-bit IF conditional expressions, for instance, are missing from the Verilog HDL and thus translating them from the non-Verilog HDL to Verilog HDL presents a problem. This means that a multi-bit IF expression in a non-Verilog HDL cannot be directly translated into Verilog HDL syntax without generating incorrect logic.

An IF expression provides a choice between several expressions. The format of an IF expression is:

IF ifcond THEN exp1 ELSE exp2 ifcond may be an expression that returns a 1-bit Boolean value, which is supported by Verilog HDL, or it may be a multiple-bit NODE expression that has no Verilog HDL equivalent.

For an IF expression in the multi-bit form, ifcond represents a multiple bit expression that describes the respective single-bit values for a vector of signals. In the above example, the expressions exp1 and exp2 must be the same width as ifcond, where the width, in bits, defines the number of signals being represented by the IF expression. For each bit indicated in ifcond, a bit check is made. If the bit being checked, referred to here as bit i, is equal to a Boolean logic "1," then bit i in exp1 is chosen for assignment. Otherwise, bit i from exp2 is chosen for assignment.

Verilog HDL syntax does not support IF expressions. The only Verilog HDL feature similar to an IF expression is the IF statement and in most cases, the IF expression can be translated to a Verilog HDL IF statement without loss of accuracy. For example, the following non-Verilog code:

a:=IF b THEN c ELSE d;

can be translated to:

always@(b or c or d)
    if(b)
        a=c;
    else
        a=d;

Verilog HDL does not have a definition of ifcond that is consistent with how ifcond may be defined in a non-Verilog HDL. In Verilog HDL, ifcond will always return a Boolean value, even if it is a multiple-bit expression. This means that a non-Verilog HDL multi-bit IF expression cannot be directly translated into a simple Verilog IF statement; to do so, would render an incorrect translation that would cause incorrect logic to be generated. Consider the following code that contains an IF expression, IF (a) THEN sigc ELSE siga;:

FUB test;
    BEGIN "test"
    INTERFACE(INPUT NODE siga[8];
        INPUT NODE sigc[8];
        INPUT NODE A[8];
        OUTPUT NODE out[8];);
    STRUCTURAL MAIN;
    BEGIN
    Out:=IF (a) THEN sigc ELSE siga;
    END;
    END;

Directly translating the IF expression contained in this code to a conditional Verilog HDL statement (IF-ELSE statement), will result in the following code:

module test1 (siga,sigc,out,a);
    input [7:0] siga;
    input [7:0] sigc;
    input [7:0] a;
    output [7:0] out;
    /* "tc 19main" */
    reg [7:0] out;
    always @ (sigc or siga or a)
    begin
    if(a)
        out=sigc;
    else
        out=siga;
    end
    endmodule In the translation, the eight-bit IF expression in the original non-Verilog HDL is not reflected in the simple IF statement that is produced by the direct translation. FIG. 1 shows the results from performing synthesis using this incorrect translation and it is clear that the intended functionality of the multi-bit IF expression has been lost in the translation process from the original non-Verilog HDL to Verilog. More importantly, this simple and direct, but incorrect, translation does not provide any error, warning, or other indication that the translation is incorrect. The synthesis result may be generated from the code by a logic synthesis tool such as the Synopsys Design Compiler™.

A possible solution to this problem is to translate each multi-bit IF expression into N if-else statements in Verilog HDL, where N represents the number of bits within the ifcond. Using this approach, for example, the above code could be translated as follows:

module tc1 (siga,sigc,out, a);
input [7:0] siga;
input [7:0] sigc;
input [7:0] a;
output [7:0] out;
reg [7:0] out;
always @(sigc or siga or a)
begin
if(a[0])
   out[0]=sigc[0];
else
   out [0]=siga[0];
if(a[1])
   out[1] sigc[1];
else
   out[1]=siga[1];
if(a[2])
   out[2]=sigc[2];
else
   out[2]=siga[2];
if(a[3])
   out[3]=sigc[3];
else
   out[3]=siga[3];
if(a[4])
   out[4]=sigc[4];
else
   out[4]=siga[4];
if(a [5])
   out[5]=sigc[5];
else
   out[5]=siga[5];
if(a[6])
   out[6]=sigc[6];
else
   out[6]=siga[6];
if(a[7])
   out[7]=sigc[7];
else
   out[7]=siga[7];
end
endmodule FIGS. 2 and 3 (optimized) illustrate the synthesis result that is generated from the above code by a logic synthesis tool such as the Synopsys Design Compiler.™ As shown in these figures, the straightforward solution translates the single assign statement, which contains the multi-bit IF expression, into eight different Verilog IF statements, all for the same operation. The implication of this approach is a significant increase in the complexity associated with translation. Consider, for example, a situation in which either exp1 or exp2 within the IF expression are also a multi-bit IF expression, resulting in nested multi-bit IF expressions. Likewise, either exp1 or exp2 could also be multi-bit subfield expressions (or expressions within a field of an IF expression), which would further complicate the necessary translation, making it impossible to really resolve. At a minimum, the translated code would be difficult to understand and debug, and the translator would be very difficult to maintain. In reality, then, this straightforward solution could not handle many commonly occurring situations where nested multi-bit IF expressions are used.

It can be seen that direct translation of a multi-bit IF conditional expression into a Verilog HDL conditional statement (an IF-ELSE statement) will create an incorrect result. Moreover, expanding multi-bit IF expressions multiple times into multiple, corresponding Verilog HDL IF-ELSE statements increases the complexity of the translation while at the same time reducing the readability of the translated code. There is a need in the art, therefore, to be able to readily and accurately translate multiple-bit IF expressions occurring within non-HDL, including nested multiple-bit IF expressions, for use in Verilog HDL in a manner that overcomes these problems and limitations while maintaining the Verilog HDL structure required for synthesis.

SUMMARY OF THE INVENTION

The present invention presents a method for accurately translating multiple-bit IF conditional expressions, of a non-Verilog hardware description language (HDL) program that are used to specify a logic design but are not recognized by Verilog HDL, into a syntax suitable for Verilog HDL. The methodology of the present invention may be implemented as executable computer program instructions of a computer readable medium that when executed by a processing system cause the processing system to translate non-Verilog conditional expressions to syntax recognized by Verilog HDL.

The methodology of the present invention for translating multiple-bit expressions in non-Verilog HDL to Verilog HDL includes determining the bit width of a conditional IF expression in the format of IF ifcond THEN expr1 ELSE expr2. If the conditional IF expression is a multiple-bit expression, a binary operator statement having bit-wise binary operators, including two AND operators, one OR operator, and one NOT operator, that is equivalent to the conditional IF expression is created. If either the THEN expr1 and/or the ELSE expr2 expressions are themselves multiple-bit expressions nested within the main multi-bit IF expression, then the nested multiple-bit expressions expr1 and/or expr2 in the binary operator statement must be replaced by the appropriate incremental variable(s) to create an always statement that can be translated to generate a Verilog HDL statement that is equivalent to the conditional expression. If the expr1 and/or expr2 expressions are nested multiple-bit expressions, then the always statement is created through appropriate processing of each such expr1 and/or expr2 expression that occurs within the conditional IF expression. The nested multiple-bit expressions expr1 and/or expr2 are represented within the always statement by one or more corresponding incremental variables. If neither expr1 nor expr2 expression are nested multiple-bit expressions, then the always statement does not need to be created and the binary operator statement itself is translated to generate a Verilog HDL statement that is equivalent to the conditional expression. If the conditional expression is not a multiple-bit expression, a normal translation operation is performed to generate the Verilog HDL equivalent statement.

This is repeated for each conditional expression of interest to generate the Verilog HDL statements that are representative of the conditional expressions of the non-Verilog HDL code. Synthesis by a processor of a logic synthesis tool can then be performed on the Verilog HDL statements in order to generate a logic circuit that is representative of the non-Verilog HDL program.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
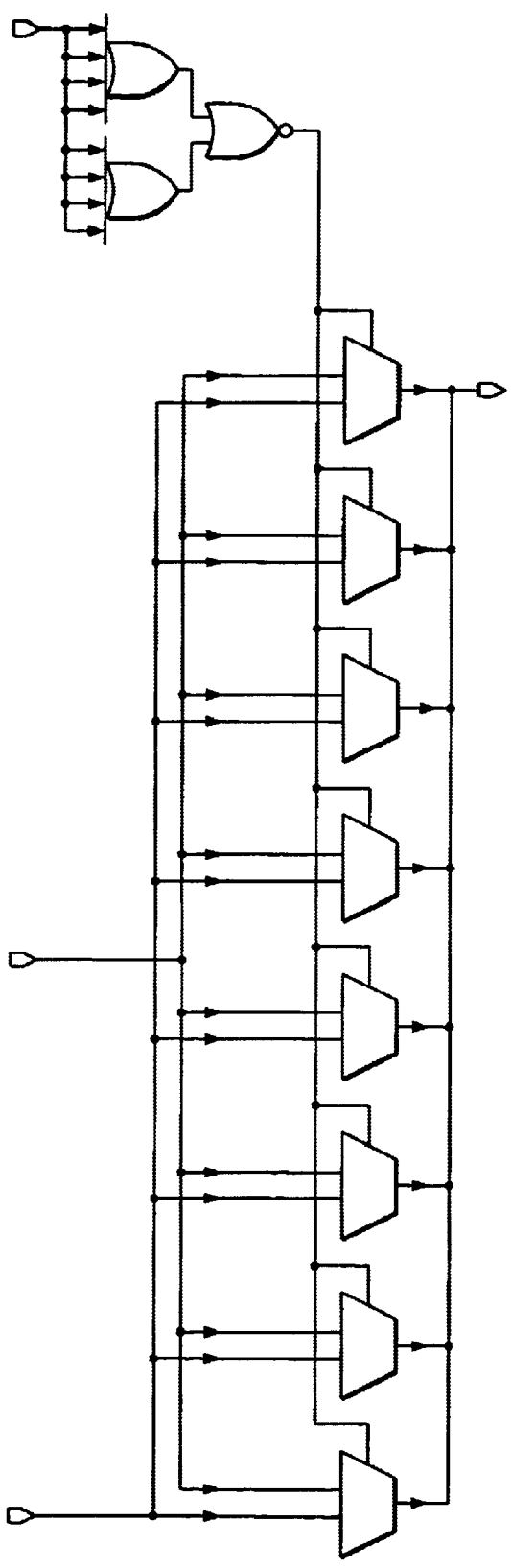
FIGS. 1–3 illustrate synthesis results generated from various translated code by a logic synthesis tool.
Figure 2:
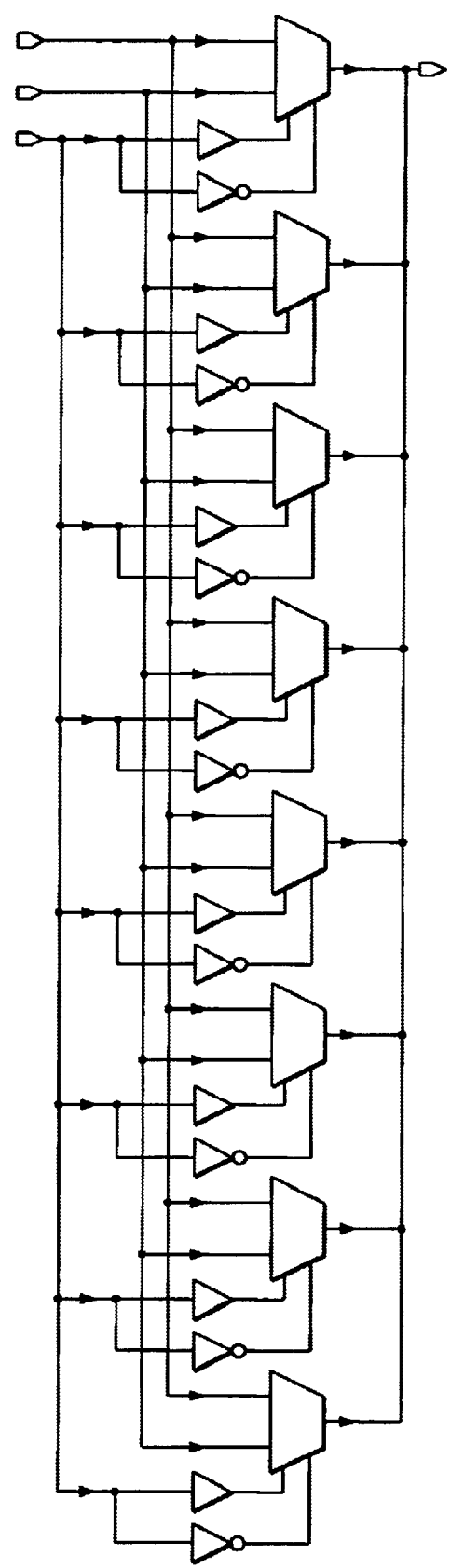

As previously described, the approach of directly translating a multi-bit IF expression into a Verilog HDL conditional statement (an IF-ELSE statement), yields an incorrect translation that will create an incorrect result. Additionally, expanding multi-bit IF expressions into multiple, corresponding Verilog HDL IF-ELSE statements greatly increases the complexity of the translation and will reduce the readability of the translated code. The present invention provides an approach for translating non-Verilog HDL code multiple-bit IF expressions, not recognized by Verilog HDL, into syntax recognizable as Verilog HDL code. All multiple-bit IF expressions, including nested multi-bit IF expressions, are translated into syntax that is readily understood as Verilog HDL syntax. The present invention is applicable to any non-Verilog HDL having multiple-bit IF expressions that must be readily and easily translated for use as Verilog HDL. Moreover, the methodology of the present invention may be implemented by a computer program of a computer-readable medium.

The present invention completely avoids the Verilog HDL conditional IF-ELSE expression, which does not support multi-bit conditional expressions, when translating a multi-bit IF conditional expression for use by Verilog HDL. The present invention instead uses bit-wise binary operators, including the bit-wise binary AND operator, "&", the bit-wise binary OR operator, "I", and the bit-wise unary NOT operator, "~", in the translation process. Using the bit-wise AND, OR, and NOT operators, a new statement having the same logic meaning as the multi-bit IF expression, from both a functional and a synthesis view, is created. The bit-wise operators are Verilog HDL operators defined in IEEE Standard Hardware Description Language Based on the Verilog Hardware Description Language 4.1.10, as operators which "shall perform bit-wise manipulations on the operands—that is, the operator shall combine a bit in one operand with its corresponding bit in the other operand to calculate one bit for the result." The following logic tables show the results of applying each of these operators in the Verilog language:

| Bit-wise binary AND operator | | |
|---|---|---|
| & | 0 | 1 |
| 0 | 0 | 0 |
| 1 | 0 | 1 |

| Bit-wise binary OR operator | | |
|---|---|---|
| I | 0 | 1 |
| 0 | 0 | 1 |
| 1 | 1 | 1 |

| Bit-wise unary NOT operator | |
|---|---|
| ~ | Output |
| 0 | 1 |
| 1 | o |

The bit-wise AND operator, &, can be used to mask off some set of bits and the bit-wise OR operator, I, can be used to turn bits on (or set them to a logical "1" value). Since the effect of using the non-Verilog HDL source language is to process each bit in ifcond individually, a combination of the bit-wise AND, OR, and the unary NOT, ~, operators can be used to create the logical equivalent of the multiple-bit IF expression. This approach works because the following multi-bit IF expression:

$$q:=\text{IF }(x)\text{ THEN }(y)\text{ ELSE }(z);$$

is equivalent to the following logical expression containing bit-wise operators, which is easily expressed in Verilog HDL:

$$q:=y \;\&\; x/z \;\&\; \sim x;$$

As an example, consider the case where, x='00101011, y='11101101, and z='00101100. Substituting for x, y, and z into the multi-bit IF expression, the result is:

$$q:=\text{IF ('00101011) THEN ('11101101) ELSE ('00101100)};$$

which yields a result, q, of '00101101.
Using approach of the present invention, the exact same result for q is obtained by applying the bit-wise AND, OR, and NOT operators, as follows:
q:=('11101101 & '00101011)/('00101100 & ~('00101011))
q:='001010011/('00101100 & '11010100)
q:='00101001/'00000100
q:='00101101

The methodology of the translation approach of the present invention is set forth in the flowcharts of FIGS. 4–7.

Figure 6:
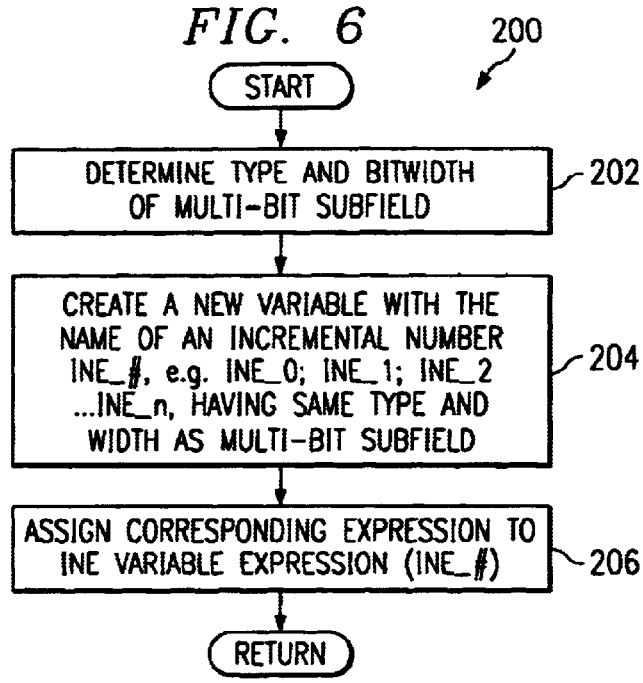
FIGS. 5–7 illustrate the overall flow of FIG. 4 in more detail, in accordance with the preferred embodiment of the present invention.
Figure 7:
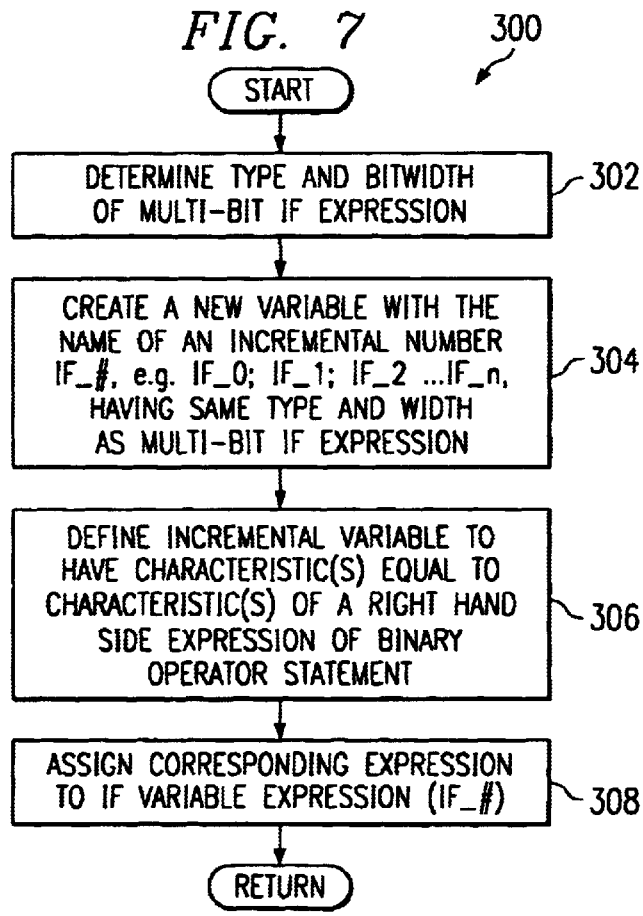
Figure 4:
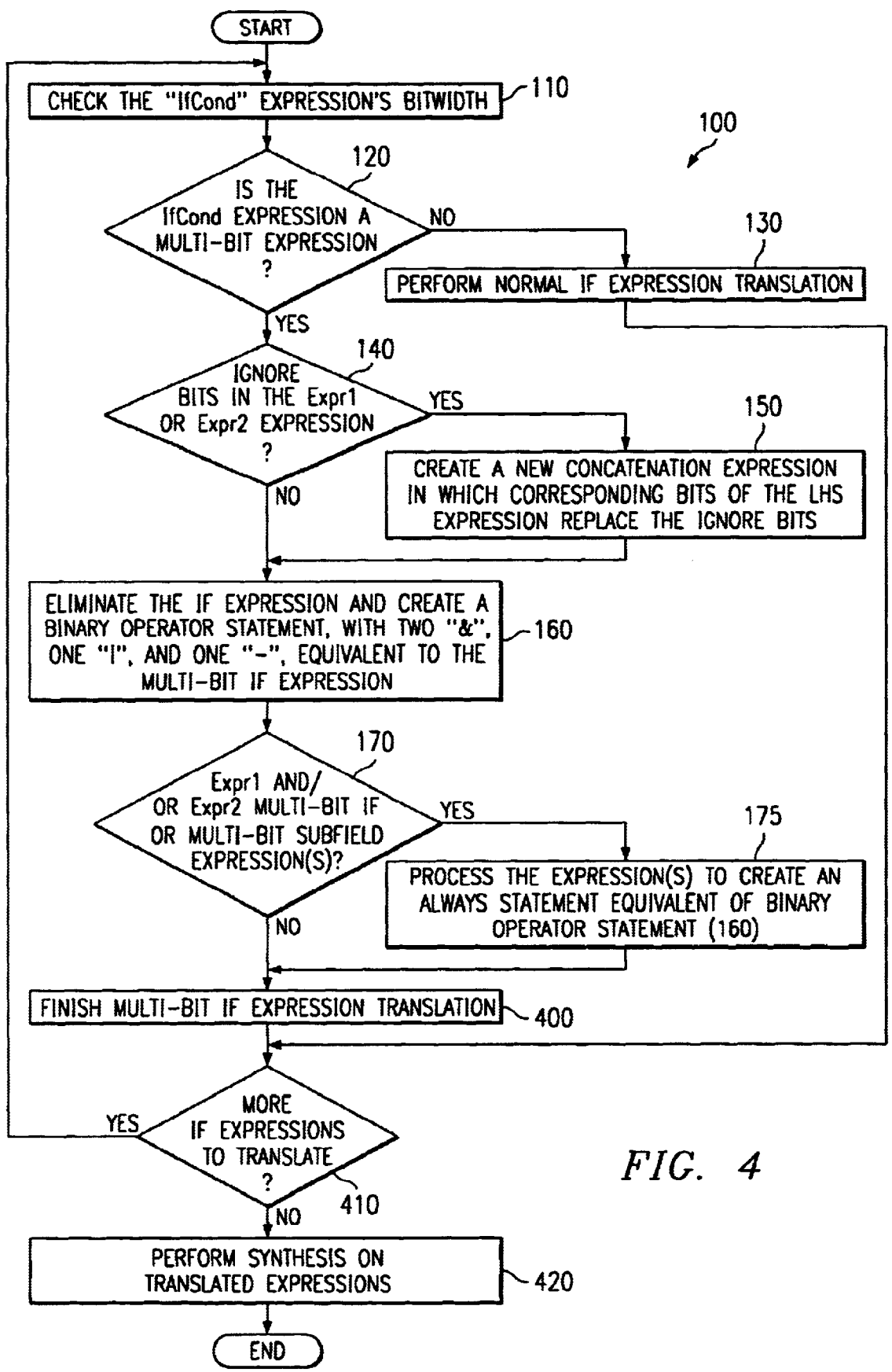
FIG. 4 illustrates an overall flow for translating non-Verilog HDL multiple-bit conditional expressions to recognizable Verilog HDL syntax, in accordance with a preferred embodiment of the present invention.
Figure 5:
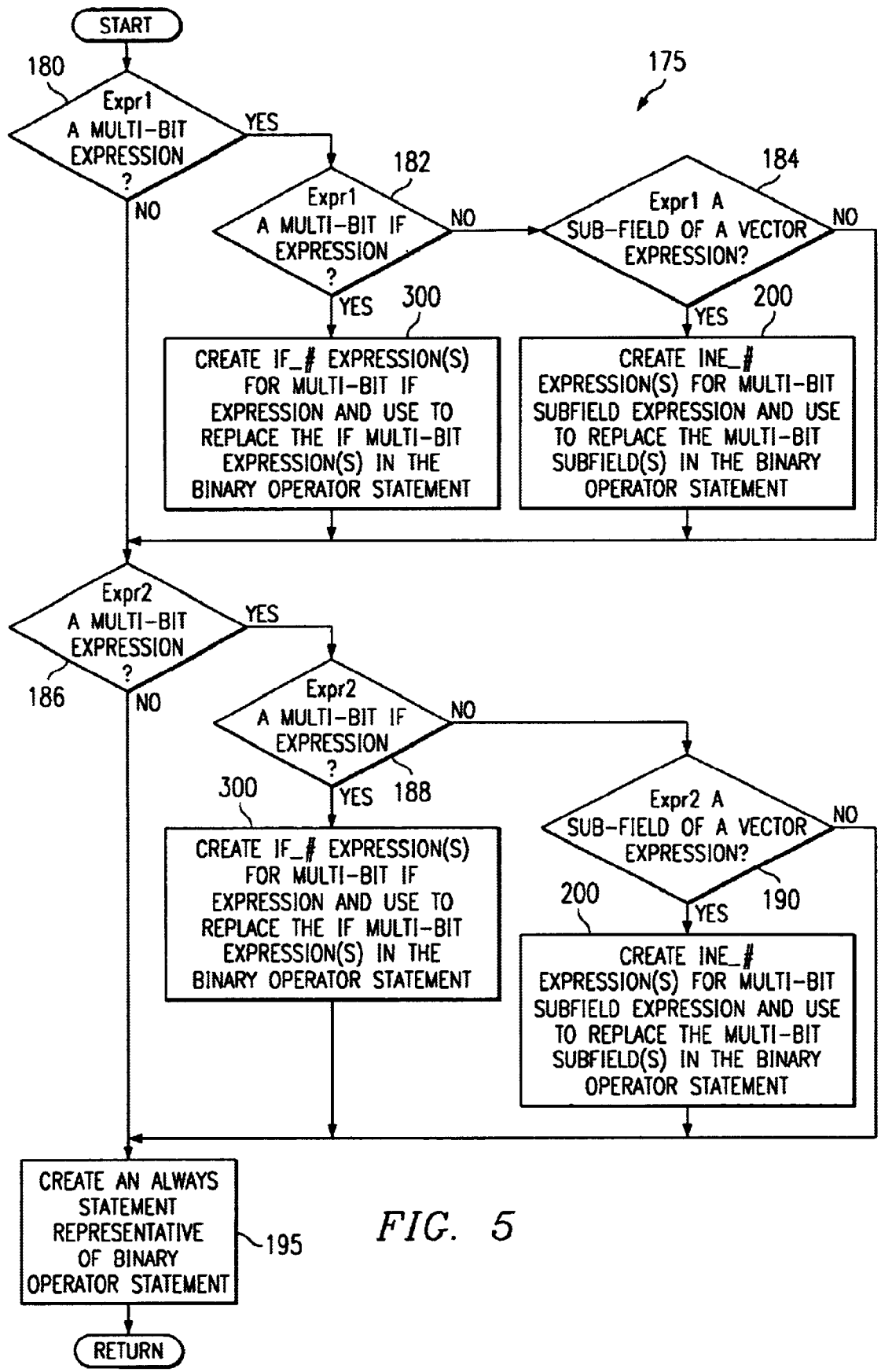

The details of FIGS. 5–7 reflect in greater detail certain blocks of overall flow 100 of FIG. 4. Referring now to FIG. 4, translation is performed on each conditional expression of interest of the non-Verilog HDL program. The bitwidth of the "ifcond" portion of an IF conditional expression is ascertained at Block 110. The bitwidth of the ifcond portion of the following IF expression, for example, is 8 bits:

INTERFACE( . . .
   INPUT NODE A[8];
   . . . );
. . .
out:=IF(a) THEN sigc ELSE siga;

The bit width of the conditional expression can be checked at some point further in the methodology, such as after Decision Block 120, Decision Block 140, etc. The inquiry at Decision Block 120 is whether the ifcond expression is a multi-bit expression. It can be seen that, in the above example in which ifcond has a bitwidth of 8 bits, the ifcond expression is a multi-bit expression. If, however, the ifcond expression were not a multi-bit expression, then normal translation of the expression would commence at Block 130.

Now, in the case in which the ifcond expression is a multi-bit expression, then a special approach for translation of multi-bit expressions, which takes into account both multi-bit IF expressions and multi-bit subfield expressions, is undertaken. At Decision Block 140, the inquiry is whether there are any ignore bits present in the THEN expression "expr1" or the ELSE expression "expr2" of the multi-bit IF expression. Ignore bits, which are different from don't care bits, must be addressed by the translator in order to obtain a correct translation. If there are ignore bits within expr1 or expr2, then a new concatenated expression in which corresponding bits of the left-hand side (LHS) expression replace the ignore bits is performed at Block 150. For example, the following multi-bit IF expression in which the THEN "expr1" expression contains two ignore bits:

out:=IF(a) THEN '1111___00; ELSE siga;

is concatenated as follows:

out:=IF(a) THEN {4'b1111, out[3:2], 2'b00}; ELSE siga;

Of course, the ignore bits could also occur in the ELSE expression "expr2" and would be handled in a similar manner. If there are no ignore bits within "expr1" or "expr", then the flow proceeds directly to Block 160.

At Block 160, a new binary operator statement, equivalent to the multi-bit IF expression but without the bothersome IF-THEN-ELSE syntax not supported by Verilog HDL, is created by utilizing the bitwise binary operators AND "&", OR "I", and NOT "~". Since in a multi-bit IF expression each bit in the ifcond expression is processed individually, a combination of the bit-wise &, I, and ~ operators can be used to achieve the same result. Consider the following two examples. First, the following multi-bit IF expression, which contains ignore bits:

out:=IF(a) THEN '1111___00; ELSE siga;

would be concatenated at Block 150, gas described previously, to produce:

out:=IF(a) THEN {4'b1111, out[3:2], 2'b00}; ELSE siga;

which would be replaced by the following equivalent operator statement in Block 160:

out:={4'b1111, out[3:2], 2'b00} & a I siga & ~a;

Second, consider the following multi-bit IF expression, which does not contain ignore bits:

out:=IF(a) THEN sigc ELSE siga;

This multi-bit IF expression would be replaced by the following equivalent operator statement at Block 160:

out=sigc & a I siga & ~a;

The next inquiry is whether there are nested multi-bit IF expressions and/or multi-bit sub-fields expressions (sub-fields of a vector expression) within the primary multi-bit IF expression. If so, these nested expressions must also be put into a form suitable for translation to HDL Verilog, accomplished at Blocks 170 and 175. At Decision Block 170, the inquiry is whether either of the THEN expr1 or the ELSE expr2 expressions are a multi-bit IF expression and/or a multi-bit subfield expression. If either, or both, the expr1 and expr2 expressions are multi-bit subfield or multi-bit IF expressions, then they must be processed at Block 175 to create a new always statement, representative of the binary operator statement, that can be translated. The processing of nested multi-bit IF expressions is explored more in FIGS. 5–7.

The translation of the multi-bit IF expression is completed at Block 400. Again, determining the type of expression and translating it accordingly is performed for every expression of interest in the non-Verilog HDL program, as ensured by Decision Block 410. Decision Block 410 inquires as to whether there are any more conditional IF expressions within the non-Verilog HDL code that need to be translated. If, yes, the flow returns to Block 110. If no, then synthesis may be performed on the translated expressions by a logic synthesis tool at Block 420 to test out the logic circuit design represented by the non-Verilog HDL. It is noted that synthesis of the translated IF statements may occur after all of the conditional IF expressions have been translated or it may occur as each IF expression is translated.

Referring now to FIG. 5, the details of Block 175 of FIG. 4 will now be explored; the flow of FIG. 5 is triggered at Block 170 if either expr1 and/or expr2 are multi-bit expressions and ensures that each nested multi-bit expression, whether IF or sub-field, is processed so that the binary operator statement generated at Block 160 can be translated to Verilog HDL format (syntax). THEN expression expr1 is considered before ELSE expression expr2, but this order may be reversed if so desired. At Decision Block 180, the inquiry is whether THEN expression expr1 is a multi-bit expression. If so, then Decision Block 182 considers whether THEN expression expr1 is a multi-bit IF expression (and not a multi-bit sub-field expression). If yes, then IF_# expressions are created for the multi-bit IF expression expr1 at Block 300, in the manner shown in FIG. 7, that replace the multi-bit IF expression expr1 in the binary operator statement. If THEN expression expr1 is not a multi-bit IF expression, then the inquiry at Decision Block 184 is whether THEN expression expr1 is a multi-bit sub-field of a vector expression. If yes, then INE_# expressions are created for the multi-bit sub-field expression expr1 at Block 200 in the manner shown in FIG. 6.

After treatment of THEN expression expr1, ELSE expression expr2 is next considered. At Decision Block 186, the inquiry is whether ELSE expression expr2 is a multi-bit expression. If no, then the flow skips down to Block 195. If ELSE expression expr2 is a multi-bit expression, it must next be determined what type of multi-bit expression it is-multi-bit IF expression or multi-bit sub-field. Decision Block 188 asks whether ELSE expression expr2 is a multi-bit IF expression. If so, then IF_# expressions are created for the multi-bit IF expression expr2 at Block 300 that can replace expr2 in the binary operator statement (shown in FIG. 7). If ELSE expression expr2 is not a multi-bit IF expression, then Decision Block 190 inquires as to whether it is a multi-bit sub-field of a vector expression. If so, then Block 200 (illustrated in FIG. 6) causes INE_# expressions to be created that can replace the multi-bit sub-field expression expr2 in the binary operator statement that was created at Block 160. If ELSE expression expr2 is neither a multi-bit IF nor sub-field expression, then flow continues directly to Block 195.

Block 195 causes an always statement to be created for each multi-bit IF expression when that multi-bit IF expression has been found to contain at least one nested multi-bit expression (Decision Block 170). The event expression of the always statement that is created at Block 195 contains the IF_# and/or INE_# expressions that replaced the nested multi-bit IF expressions and/or the multi-bit sub-field expressions, respectively, during the flow of FIG. 5. The always statement is equivalent to the binary operator statement created at Block 160 but treats the nested multi-bit expressions expr1 and/or expr2 in a manner that allows translation of the statement into Verilog HDL to occur. As is known in IEEE syntax, the event expression of an always statement is an event identifier, such as a posedge expression or a negedge expression.

Flow 200 of FIG. 6 illustrates the methodology for creating INE_# variables for each multi-bit subfield that was identified at Decision Blocks 184 and 190 of FIG. 5. Each nested multi-bit sub-field expression so identified will be replaced with a created incremental number, INE_#. At Block 202, the type and bitwidth of the multi-bit sub-field (expr1 or expr2) is determined; examples of sub-field type include TRI-state bus, NTRI-state bus, etc. The INE_# variable that is created is of the same type and bitwidth as the multi-bit subfield. Next, at Block 204 a new variable with the name of an incremental number, INE_#, is created. The incremental variable is representative of a corresponding variable of the multi-bit sub-field expression. If the sub-field contains more than one variable, then an incremental variable INE_# is created for each variable of the subfield expression, e.g. INE_0; INE_1; INE_2; . . . ; INE_n are created for a nested multi-bit subfield expression containing n variables. Next, at Block 206 the multi-bit sub-field expression is assigned to the incremental variable INE_# and the incremental variable INE_# will replace the sub-field expression in the event expression of the always statement that will be created at Block 195 of FIG. 5. Following completion of the flow of FIG. 6, the process returns to Block 400 of FIG. 4 where the translation process is finished for the multi-bit IF expression of interest.

The applicability of FIG. 6 for nested multi-bit sub-field expressions is further illustrated by the following example. Consider the following multi-bit IF expression containing a nested sub-field of a vector expression, in which q, a, and b are each 8 bits wide and k and h are each 32 bits wide:

q:=IF (a) THEN b ELSE (k XOR h)[27:20];

According to the methodology of the present invention, this multi-bit IF expression containing a nested ELSE expr2 multi-bit sub-field of a vector, is translated to the following equivalent always statement (the intermediate step of creating the binary operator statement (such as at Block 160 is not shown separately in this example):

always @ (INE_0 or k or h or b or a) begin
   INE_0=(k ^ h);
   q=b & a/INE_0[27.20] & ~a;
end Flow 300 of FIG. 7 illustrates the methodology for creating IF_# variables for each multi-bit IF expression that was identified at Decision Blocks 182 and 188 of FIG. 5. Each nested multi-bit IF expression so identified will be replaced with a created incremental number, IF_#. At Block 302, the type and bit width of the multi-bit IF expression (expr1 or expr2) is determined. The IF_# variable that is created is of the same type and bit width as the multi-bit IF expression. Next, at Block 304 a new variable with the name of an incremental number, IF_#, is created. The incremental variable is representative of a corresponding variable of the multi-bit IF expression. If the IF expression contains more than one variable, then an incremental variable IF_# is created for each variable of the IF expression, e.g. IF_0; IF_1; IF_2; . . . ; IF_n are created for a nested multi-bit IF expression containing n variables.

At Block 306 the incremental variable IF_# is defined to have one or more characteristics, such as width and type, that are equal to one or more characteristics of the right hand side expression of the binary operator statement. For an IF expression, this will include going down to the expr1 and expr2 expression level to define the incremental variable(s). Next, at Block 308 the multi-bit IF expression is assigned to the incremental variable IF_# and the incremental variable IF_# will replace the nested multi-bit IF expression in the event expression of the always statement that will be created at Block 195 of FIG. 5. Following completion of the flow of FIG. 6, the process returns to Block 400 of FIG. 4 where the translation process is finished for the current multi-bit conditional expression of interest.

An example of the translation for an IF expression having a nested single-bit IF expression may be as follows:

q=IF(IF(a) THEN b ELSE c) THEN d ELSE e;

is translated to:

if(a) ICC_0=b;
else
ICC_0=c,
if (ICC_0)q=d;
else
q=e;

It is noted that this translation is correct only if q, a, b, c, d, and e are each single bit width. Following is the translation of the same IF expression which is now a multi-bit IF expression having nested multi-bit IF expressions in which q, a, b, c, d, and e are multi-bit width:

always @ (a or b or c or ICC_0 or d or e) begin
   ICC_0=a&b/c& ~a;
   q=ICC_0 & d/e& ~ICC_0;
end As with flow 200 of FIG. 6, following the completion of the flow of FIG. 7, the process returns to Block 400 of FIG. 4.

The above description shows that the present invention, in addition to handling the nested multi-bit sub-field of a vector expression, is equally well suited to handle the previously difficult problem of the multi-bit IF expression. Consider the following nested multi-bit IF expression in which a and b represent multi-bit expressions:

q:=IF (a) THEN IF(b) THEN (c) ELSE (d) ELSE (e);

According to the methodology of the present invention embodied in FIGS. 4–5 and 7, this multi-bit IF expression containing a nested multi-bit expression is translated to create the following new equivalent always statement (the intermediate step of creating the binary operator statement described at Block 160 is now illustrated as a separate step here):

```
always @ (a or b or c or ICC_0 or d or e) begin
  ICC_0=c & b/d & ~b;
  q=ICC_0 & a/e & ~a;
end
```

To further illustrate the translation methodology of the present invention, consider the following code (previously listed in the Background of the Invention section), which contains IF expression, IF (a) THEN sigc ELSE siga;:

```
FUB test;
BEGIN "test"
INTERFACE(INPUT NODE siga[8];
  INPUT NODE sigc[8];
  INPUT NODE A[8];
  OUTPUT NODE out[8];);
STRUCTURAL MAIN;
BEGIN
Out:=IF (a) THEN sigc ELSE siga;
END;
END;
```

This code is translated according to the present invention to the following Verilog HDL acceptable syntax:

```
module tc2(siga,sigc,out, a);
input [7:0] siga;
input [7:0] sigc;
input [7:0] a;
output [7:0] out;
reg [7:0] out;
  always @ (sigc or siga or a)
  begin
  out=sigc & a/siga & ~a;
  end
endmodule
```

Figure 3:
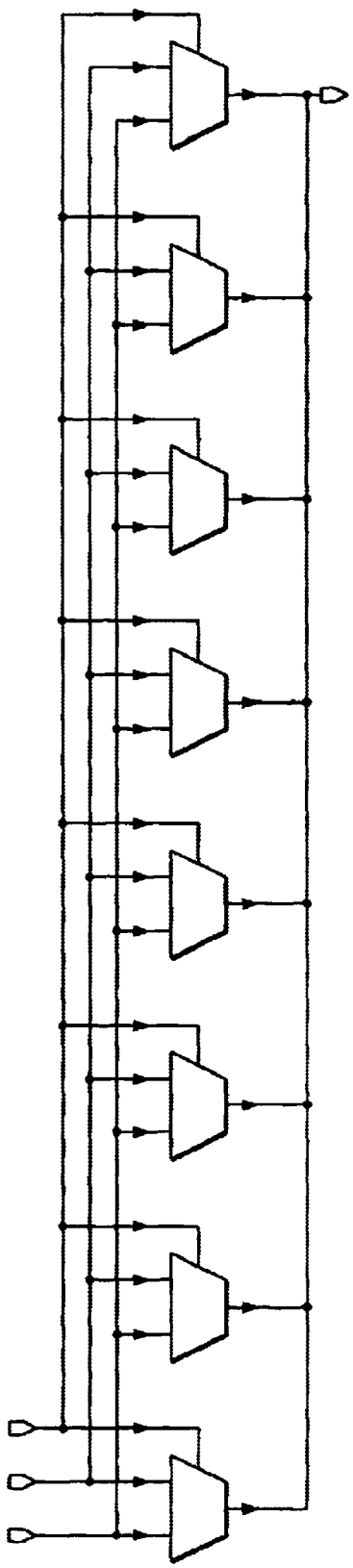
Figure 8:
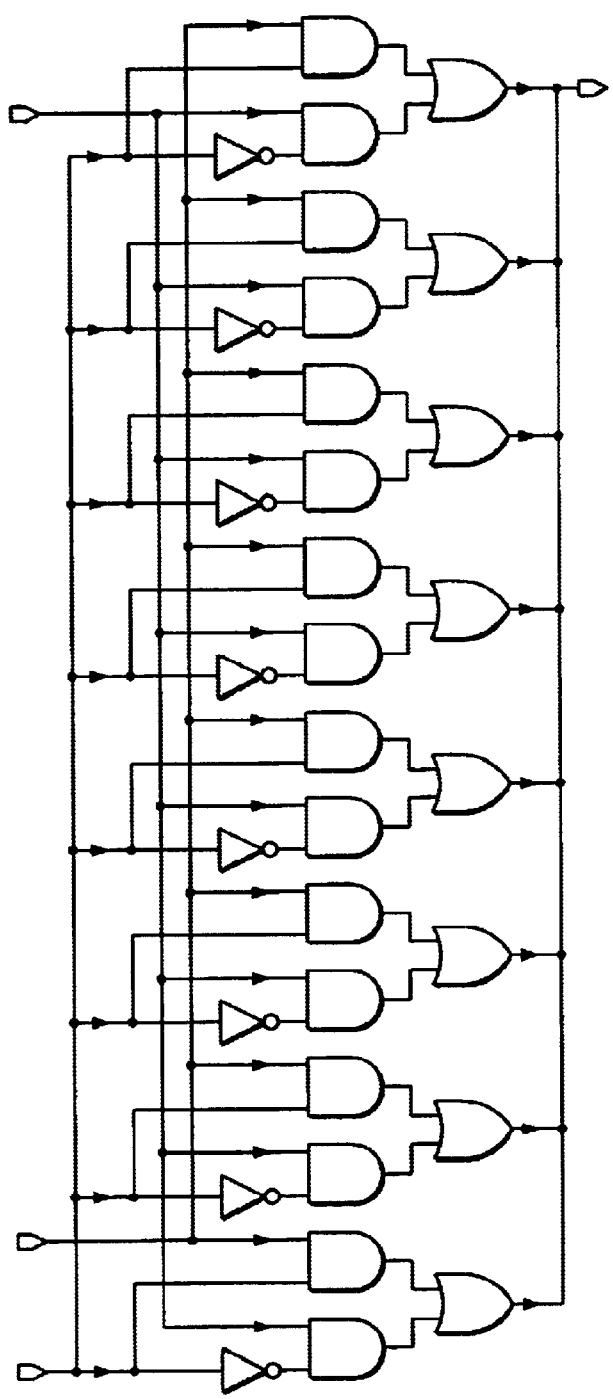
FIGS. 8–9 illustrate synthesis results generated from various translated code by a logic synthesis tool, in accordance with the present invention.
Figure 9:
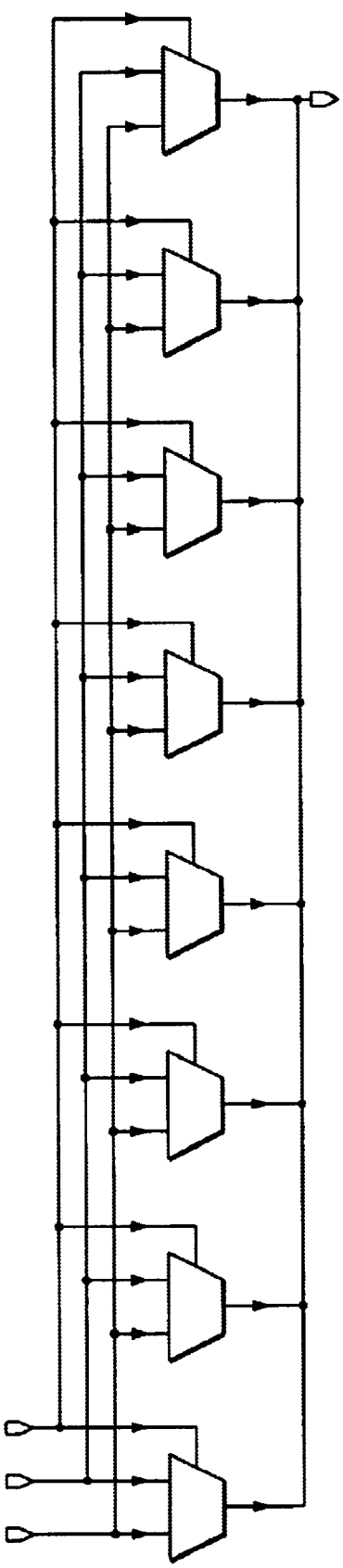

The schematics of FIGS. 8 and 9 (optimized) illustrate the synthesis result that is generated from the above, translated code by a logic synthesis tool. Please note that the optimized solution is identical to FIG. 3, which was the schematic generated using the brute-force approach in which the multiple-bit IF expression was expanded into N number of IF statements.

While the invention has been particularly shown and described with reference to a preferred embodiment, it will be understood by those skilled in the art that various changes in form and detail may be made therein without departing from the spirit and scope of the invention.

What is claimed is:

1. A method of translating multiple-bit conditional expressions, of a non-Verilog hardware description language (HDL) program used to specify a logic design to Verilog HDL, comprising:
   a) for a conditional expression of the non-Verilog HDL program, having a format of IF ifcond THEN expr1 ELSE expr2, determining a bit width of the conditional expression;
   b) if the conditional expression is a multiple-bit expression, the method further comprising:
      1) creating a binary operator statement, having a plurality of bit-wise binary operators, that is equivalent to the conditional expression;
      2) determining whether at least one of the expr1 expression or the expr2 expression are multiple-bit expressions nested within the binary operator statement;
      3) if at least one of the expr1 expression or the expr2 expression are multiple-bit expressions nested within the binary operator statement, processing the at least one of the expr1 expression or the expr2 expression to create an always statement, equivalent to the binary operator statement and having the plurality of bit-wise binary operators, containing one or more incremental variables representative of the at least one of the expr1 expression or the expr2 expression that are multiple-bit expressions and translating the always statement to generate a Verilog HDL statement equivalent to the conditional expression; and
      4) if the at least one of the expr1 expression or the expr2 expression are not multiple-bit expressions, translating the binary operator statement to generate a Verilog HDL statement equivalent to the conditional expression;
   c) repeating a)–b) for each conditional expression of a plurality of conditional expressions of the non-Verilog HDL program to generate a plurality of Verilog HDL statements equivalent to the plurality of conditional expressions; and
   d) performing synthesis on the plurality of Verilog HDL statements to generate a logic circuit representative of the non-Verilog HDL program.

2. The method of claim 1, wherein the plurality of bit-wise binary operators of the binary operator statement comprise a first AND operator, a second AND operator, an OR operator, and a NOT operator.

3. The method of claim 1, further comprising:
   if the conditional expression is not a multiple-bit expression, performing a normal translation operation to generate the Verilog HDL equivalent statement.

4. The method of claim 1, wherein prior to creating the binary operator statement, further comprising:
   determining whether either the expr1 expression or the expr2 expression of the conditional expression have ignore bits;
   if the expr1 expression has one or more expr1 ignore bits, creating a concatenated expr1 expression in which the one or more expr1 ignore bits are replaced by corresponding expr1 bits of a left hand side expression of the conditional expression; and
   if the expr2 expression has one or more expr2 ignore bits, creating a concatenated expr2 expression in which the one or more expr2 ignore bits are replaced by corresponding expr2 bits of the left hand side expression.

5. A computer readable medium containing executable instructions which, when executed in a processing system, causes the system to translate multiple-bit conditional expressions, of a non-Verilog hardware description language (HDL) program used to specify a logic design, to Verilog HDL, comprising:
   a) for a conditional expression of the non-Verilog HDL program, having a format of IF ifcond THEN expr1 ELSE expr2, instructions for determining a bit width of the conditional expression;
   b) if the conditional expression is a multiple-bit expression, the computer roadable medium further comprising:
      1) instructions for creating a binary operator statement, having a plurality of bit-wise binary operators, that is equivalent to the conditional expression;
      2) instructions for determining whether at least one of the expr1 expression or the expr2 expression are multiple-bit expressions nested within the binary operator statement;

3) if at least one of the expr1 expression or the expr2 expression are multiple-bit expressions nested within the binary operator statement, instructions for processing the at least one of the expr1 expression or the expr2 expression to create an always statement, equivalent to the binary operator statement and having the plurality of bit-wise binary operators, containing one or more incremental variables representative of the at least one of the expr1 expression or the expr2 expression that are multiple-bit expressions and translating the always statement to generate a Verilog HDL statement equivalent to the conditional expression; and 4) if the at least one of the expr1 expression or the expr2 expression are not multiple-bit expressions, instructions for translating the binary operator statement to generate a Verilog HDL statement equivalent to the conditional expression; and c) repeating a)–b) for each conditional expression of a plurality of conditional expressions of the non-Verilog HDL program to generate a plurality of Verilog HDL statements equivalent to the plurality of conditional expressions.

6. The computer-readable medium of claim 5, further comprising:

d) instructions for performing synthesis on the plurality of Verilog HDL statements to generate a logic circuit representative of the non-Verilog HDL program.

7. The computer-readable medium of claim 5, wherein the plurality of bit-wise binary operators of the binary operator statement comprise a first AND operator, a second AND operator, an OR operator, and a NOT operator.

8. The computer-readable medium of claim 5, further comprising:

if the conditional expression is not a multiple-bit expression, instructions for performing a normal translation operation to generate the Verilog HDL equivalent statement.

9. The computer-readable medium of claim 5, wherein prior to creating the binary operator statement, further comprising:

instructions for determining whether either the expr1 expression or the expr2 expression of the conditional expression have ignore bits;

if the expr1 expression has one or more expr1 ignore bits, instructions for creating a concatenated expr1 expression in which the one or more expr1 ignore bits are replaced by corresponding expr1 bits of a left hand side expression of the conditional expression; and if the expr2 expression has one or more expr2 ignore bits, instructions for creating a concatenated expr2 expression in which the one or more expr2 ignore bits are replaced by corresponding expr2 bits of the left hand side expression.

10. A method of translating multiple-bit conditional expressions, of a non-Verilog hardware description language (HDL) program used to specify a logic design, to Verilog HDL, comprising:

a) for a conditional expression of the non-Verilog HDL program, having a format of IF ifcond THEN expr1 ELSE expr2, determining a bit width of the conditional expression;

b) if the conditional expression is a multiple-bit expression:

1) creating a binary operator statement, having a plurality of bit-wise binary operators, that is equivalent to the conditional expression;

2) determining whether at least one of the expr1 expression or the expr2 expression are multiple-bit expressions nested within the binary operator statement;

3) if at least one of the expr1 expression or the expr2 expression are not multiple-bit expressions nested within the binary operator statement, translating the binary operator statement to generate a Verilog HDL statement equivalent to the conditional expression; and 4) if at least one of the expr1 expression or the expr2 expression are multiple-bit expressions nested within the binary operator statement, the method further comprising:

A) if the expr1 expression is an expr1 multiple-bit IF expression, creating one or more expr1 IF variables of the form expr1 IF_# and replacing the expr1 expression with the one or more expr1 IF variables in an always statement that is equivalent to the binary operator statement;

B) if the expr1 expression is an expr1 multiple-bit sub-field, creating one or more expr1 sub-field variables of the form expr1 INE_# and replacing the expr1 expression with the one or more expr1 sub-field variables in the always statement;

C) if the expr2 expression is an expr2 multiple-bit IF expression, creating one or more expr2 IF variables of the form expr2 IF_# and replacing the expr2 expression with the one or more expr2 IF variables in the always statement;

D) if the expr2 expression is an expr2 multiple-bit sub-field, creating one or more expr2 sub-field variables of the form expr2 INE_# and replacing the expr2 expression with the one or more expr2 sub-field variables in the always statement; and E) translating the always statement to generate a Verilog HDL statement equivalent to the conditional expression;

c) repeating a)–b) for each conditional expression of a plurality of conditional expressions of the non-Verilog HDL program to generate a plurality of Verilog HDL statements equivalent to the plurality of conditional expressions; and d) performing synthesis on the plurality of Verilog HDL statements to generate a logic circuit representative of the non-Verilog HDL program.

11. The method of claim 10, wherein creating the one or more expr1 IF variables and replacing the expr1 expression with the one or more expr1 IF variables if the expr1 expression is an expr1 multiple-bit IF expression, further comprises:

determining a type and a bit width of the expr1 expression;

creating the one or more expr1 IF variables having the type and type bit width of the expr1 expression;

defining the one or more expr1 IF variables to have characteristics equivalent to a right hand side expression of the binary operator statement; and assigning the expr1 expression to the one or more expr1 IF variables.

12. The method of claim 10, wherein creating the one or more expr1 sub-field variables and replacing the expr1 expression with the one or more expr1 sub-field variables if the expr1 expression is an expr1 multiple-bit sub-field, further comprises:

determining a type and a bit width of the expr1 expression;

creating the one or more expr1 sub-field variables having the type and type bit width of the expr1 expression; and assigning the expr1 expression to the one or more expr1 sub-field variables.

13. The method of claim 10, wherein creating the one or more expr2 IF variables and replacing the expr2 expression with the one or more expr2 IF variables if the expr1 expression is an expr2 bit-bit IF expression, further comprises:

determining a type and a bit width of the expr2 expression;

creating the one or more expr2 IF variables having the type and type bit width of the expr2 expression;

defining the one or more expr2 IF variables to have characteristics equivalent to a right hand side expression of the binary operator statement; and assigning the expr2 expression to the one or more expr2 IF variables.

14. The method of claim 10, wherein creating the one or more expr2 sub-field variables and replacing the expr2 expression with the one or more expr2 sub-field variables if the expr2 expression is an expr2 multiple-bit sub-field, further comprises:

determining a type and a bit width of the expr2 expression;

creating the one or more expr2 sub-field variables having the type and type bit width of the expr2 expression; and assigning the expr2 expression to the one or more expr1 sub-field variables.

15. The method of claim 10, wherein the plurality of bit-wise binary operators of the binary operator statement comprise a first AND operator, a second AND operator, an OR operator, and a NOT operator.

16. The method of claim 10, further comprising:

if the conditional expression is not a multiple-bit expression, performing a 7 normal translation operation to generate the Verilog HDL equivalent statement.

17. The method of claim 10, wherein prior to creating the binary operator statement, further comprising:

determining whether either the expr1 expression or the expr2 expression of the conditional expression have ignore bits;

it the expr1 expression has one or more expr1 ignore bits, creating a concatenated expr1 expression in which the one or more expr1 ignore bits are replaced by corresponding expr1 bits of a left hand side expression of the conditional expression; and if the expr2 expression has one or more expr2 ignore bits, creating a concatenated expr2 expression in which the one or more expr2 ignore bits are replaced by corresponding expr2 bits of the left hand side expression.

18. A computer readable medium containing executable instructions which, when executed in a processing system, causes the system to translate multiple-bit conditional expressions, of a non-Verilog hardware description language (HDL) program used to specify a logic design, to Verilog HDL, comprising:

a) for a conditional expression of the non-Verilog HDL program, having a format of IF ifcond THEN expr1 ELSE expr2, instructions for determining a bit width of the conditional expression;

b) if the conditional expression is a multiple-bit expression, the computer readable medium further comprising:

1. instructions for creating a binary operator statement, having a plurality of bit-wise binary operators, that is equivalent to the conditional expression;

2. instructions for determining whether at least one of the expr1 expression or the expr2 expression are multiple-bit expressions nested within the binary operator statement;

3. if at least one of the expr1 expression or the expr2 expression are not multiple-bit expressions nested within the binary operator statement, instructions for translating the binary operator statement to generate a Verilog HDL statement equivalent to the conditional expression;

4. if at least one of the expr1 expression or the expr2 expression are multiple-bit expressions nested within the binary operator statement, the computer readable medium further comprising:

A. if the expr1 expression is an expr1 multiple-bit IF expression, instructions for creating one or more expr1 IF variables of the form expr1 IF_# and replacing the expr1 expression with the one or more expr1 IF variables in an always statement that is equivalent to the binary operator statement;

B. if the expr1 expression is an expr1 multiple-bit sub-field, instructions for creating one or more expr1 sub-field variables of the form expr1 INE_# and replacing the expr1 expression with the one or more expr1 sub-field variables in the always statement;

C. if the expr2 expression is an expr2 multiple-bit IF expression, instructions for creating one or more expr2 IF variables of the form expr2 IF_# and replacing the expr expression with the one or more expr2 IF variables in the always statement;

D. if the expr2 expression is an expr2 multiple-bit sub-field, instructions for creating one or more expr2 sub-field variables of the form expr2 INE_# and replacing the expr2 expression with the one or more expr2 sub-field variables in the always statement; and E. instructions for translating the always statement to generate a Verilog HDL statement equivalent to the conditional expression; and c) repeating a)–b) for each conditional expression of a plurality of conditional expressions of the non-Verilog HDL program to generate a plurality of Verilog HDL statements equivalent to the plurality of conditional expressions.

19. The computer-readable medium of claim 18, further comprising:

d) instructions for performing synthesis on the plurality of Verilog HDL statements to generate a logic circuit representative of the non-Verilog HDL program.

20. The computer-readable medium of claim 18, wherein creating the one or more expr1 IF variables and replacing the expr1 expression with the one or more expr1 IF variables if the expr1 expression is an expr1 bit-bit IF expression, further comprises:

instructions for determining a type and a bit width of the expr1 expression;

instructions for creating the one or more expr1 IF variables having the type and type bit width of the expr1 expression;

instructions for defining the one or more expr1 IF variables to have characteristics equivalent to a right hand side expression of the binary operator statement; and instructions for assigning the expr1 expression to the one or more expr1 IF variables.

21. The computer-readable medium of claim 18, wherein creating the one or more expr1 sub-field variables and replacing the expr1 expression with the one or more expr1 sub-field variables if the expr1 expression is an expr1 multiple-bit sub-field, further comprises:

instructions for determining a type and a bit width of the expr1 expression;

instructions for creating the one or more expr1 sub-field variables having the type and type bit width of the expr1 expression; and instructions for assigning the expr1 expression to the one or more expr1 sub-field variables.

22. The computer-readable medium of claim 18, wherein creating the one or more expr2 IF variables and replacing the expr2 expression with the one or more expr2 IF variables if the expr1 expression is an expr2 bit-bit IF expression, further comprises:

instructions for determining a type and a bit width of the expr2 expression;

instructions for creating the one or more expr2 IF variables having the type and type bit width of the expr2 expression;

instructions for defining the one or more expr2 IF variables to have characteristics equivalent to a right hand side expression of the binary operator statement; and instructions for assigning the expr2 expression to the one or more expr2 IF variables.

23. The computer-readable medium of claim 18, wherein creating the one or more expr2 sub-field variables and replacing the expr2 expression with the one or more expr2 sub-field variables if the expr2 expression is an expr2 multiple-bit sub-field, further comprises:

instructions for determining a type and a bit width of the expr2 expression;

instructions for creating the one or more expr2 sub-field variables having the type and type bit width of the expr2 expression; and instructions for assigning the expr2 expression to the one or more expr1 sub-field variables.

24. The computer-readable medium of claim 18, further comprising:

if the conditional expression is not a multiple-bit expression, instructions for performing a normal translation operation to generate the Verilog HDL equivalent statement.

25. The computer-readable medium of claim 18, wherein prior to creating the binary operator statement, further comprising:

instructions for determining whether either the expr1 expression or the expr2 expression of the conditional expression have ignore bits;

if the expr1 expression has one or more expr1 ignore bits, instructions for creating a concatenated expr1 expression in which the one or more expr1 ignore bits are replaced by corresponding expr1 bits of a left hand side expression of the conditional expression; and if the expr2 expression has one or more expr2 ignore bits, instructions for creating a concatenated expr2 expression in which the one or more expr2 ignore bits are replaced by corresponding expr2 bits of the left hand side expression.

* * * * *